United States Patent
Dang et al.

(10) Patent No.: US 11,201,138 B2
(45) Date of Patent: Dec. 14, 2021

(54) WAFER LEVEL INTEGRATION INCLUDING DESIGN/CO-DESIGN, STRUCTURE PROCESS, EQUIPMENT STRESS MANAGEMENT AND THERMAL MANAGEMENT

(71) Applicant: International Business Machines Corporation, Armonk, NY (US)

(72) Inventors: Bing Dang, Chappaqua, NY (US);
Li-Wen Hung, Mahopac, NY (US);
John U. Knickerbocker, Monroe, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 16/717,068

(22) Filed: Dec. 17, 2019

(65) Prior Publication Data
US 2020/0126951 A1 Apr. 23, 2020

Related U.S. Application Data

(62) Division of application No. 15/272,804, filed on Sep. 22, 2016, now Pat. No. 10,546,836.

(51) Int. Cl.
*H01L 25/065* (2006.01)
*H01L 23/00* (2006.01)
(Continued)

(52) U.S. Cl.
CPC .... *H01L 25/0657* (2013.01); *H01L 21/02118* (2013.01); *H01L 21/02282* (2013.01);
(Continued)

(58) Field of Classification Search
CPC ..... H01L 25/0657; H01L 24/83; H01L 24/94; H01L 23/481; H01L 24/81;
(Continued)

(56) References Cited

U.S. PATENT DOCUMENTS 5,241,210 A 8/1993 Nakagawa et al.
6,576,081 B2 6/2003 Date et al.
(Continued)

OTHER PUBLICATIONS

Non-Final Office Action for U.S. Appl. No. 15/272,804 dated Jan. 26, 2018.
(Continued)

*Primary Examiner* — Shahed Ahmed
*Assistant Examiner* — Vicki B. Booker
(74) *Attorney, Agent, or Firm* — Fleit Intellectual Property Law; Donna Flores

(57) ABSTRACT

A method of manufacturing a multi-layer wafer is provided. Under bump metallization (UMB) pads are created on each of two heterogeneous wafers. A conductive means is applied above the UMB pads on at least one of the two heterogeneous wafers. The two heterogeneous wafers are low temperature bonded to adhere the UMB pads together via the conductive means. At least one stress compensating polymer layer may be applied to at least one of two heterogeneous wafers. The stress compensating polymer layer has a polymer composition of a molecular weight polymethylmethacrylate polymer at a level of 10-50% with added liquid multifunctional acrylates forming the remaining 50-90% of the polymer composition.

14 Claims, 12 Drawing Sheets

(51) Int. Cl.
  *H01L 21/02* (2006.01)
  *H01L 25/00* (2006.01)
  *H01L 23/48* (2006.01)

(52) U.S. Cl.
  CPC ............ *H01L 23/481* (2013.01); *H01L 24/05* (2013.01); *H01L 24/17* (2013.01); *H01L 24/19* (2013.01); *H01L 24/24* (2013.01); *H01L 24/73* (2013.01); *H01L 24/81* (2013.01); *H01L 24/83* (2013.01); *H01L 24/92* (2013.01); *H01L 24/94* (2013.01); *H01L 25/50* (2013.01); *H01L 24/03* (2013.01); *H01L 24/11* (2013.01); *H01L 24/13* (2013.01); *H01L 24/16* (2013.01); *H01L 24/27* (2013.01); *H01L 24/29* (2013.01); *H01L 24/32* (2013.01); *H01L 2224/0391* (2013.01); *H01L 2224/0401* (2013.01); *H01L 2224/11005* (2013.01); *H01L 2224/1132* (2013.01); *H01L 2224/1141* (2013.01); *H01L 2224/1146* (2013.01); *H01L 2224/11614* (2013.01); *H01L 2224/131* (2013.01); *H01L 2224/133* (2013.01); *H01L 2224/13021* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/13294* (2013.01); *H01L 2224/16145* (2013.01); *H01L 2224/16147* (2013.01); *H01L 2224/24145* (2013.01); *H01L 2224/27845* (2013.01); *H01L 2224/2919* (2013.01); *H01L 2224/29186* (2013.01); *H01L 2224/32145* (2013.01); *H01L 2224/73209* (2013.01); *H01L 2224/818* (2013.01); *H01L 2224/8109* (2013.01); *H01L 2224/81191* (2013.01); *H01L 2224/81203* (2013.01); *H01L 2224/81224* (2013.01); *H01L 2224/81409* (2013.01); *H01L 2224/81411* (2013.01); *H01L 2224/81413* (2013.01); *H01L 2224/81416* (2013.01); *H01L 2224/81439* (2013.01); *H01L 2224/81444* (2013.01); *H01L 2224/81447* (2013.01); *H01L 2224/81455* (2013.01); *H01L 2224/81464* (2013.01); *H01L 2224/81469* (2013.01); *H01L 2224/81815* (2013.01); *H01L 2224/821* (2013.01); *H01L 2224/83002* (2013.01); *H01L 2224/8309* (2013.01); *H01L 2224/8313* (2013.01); *H01L 2224/83132* (2013.01); *H01L 2224/83193* (2013.01); *H01L 2224/83862* (2013.01); *H01L 2224/83868* (2013.01); *H01L 2224/83871* (2013.01); *H01L 2224/83896* (2013.01); *H01L 2224/83907* (2013.01); *H01L 2224/83909* (2013.01); *H01L 2224/83948* (2013.01); *H01L 2224/9202* (2013.01); *H01L 2224/92124* (2013.01); *H01L 2224/94* (2013.01); *H01L 2225/06513* (2013.01); *H01L 2225/06541* (2013.01); *H01L 2924/014* (2013.01); *H01L 2924/1033* (2013.01); *H01L 2924/10253* (2013.01); *H01L 2924/10254* (2013.01); *H01L 2924/10272* (2013.01); *H01L 2924/15787* (2013.01); *H01L 2924/15788* (2013.01); *H01L 2924/3511* (2013.01)

(58) Field of Classification Search
  CPC ......... H01L 21/02118; H01L 21/02282; H01L 24/19; H01L 24/92; H01L 24/05; H01L 24/17; H01L 25/50; H01L 24/24; H01L 224/73; H01L 2224/13294; H01L 2224/9202; H01L 24/13; H01L 2224/32145; H01L 2224/8109; H01L 2224/81224; H01L 2224/8309; H01L 2224/83132; H01L 2224/1146; H01L 2224/13021; H01L 2224/83896; H01L 24/32; H01L 2224/83868; H01L 2224/81815; H01L 2224/27845; H01L 2224/2919; H01L 2224/11005; H01L 2224/83909; H01L 2224/1647; H01L 2224/81203; H01L 2224/83871; H01L 2224/8313; H01L 2224/83907; H01L 2224/83193; H01L 2224/1132; H01L 2224/1141; H01L 2224/29186; H01L 2924/15788; H01L 2224/131; H01L 2224/94; H01L 2224/81191; H01L 2224/0391; H01L 24/16; H01L 24/27; H01L 2224/83862; H01L 24/29; H01L 2224/133; H01L 2224/83002; H01L 2224/83948; H01L 24/03; H01L 24/11; H01L 2224/0401; H01L 2224/818; H01L 2924/3511; H01L 2924/10253; H01L 2924/1033; H01L 2924/10272; H01L 2924/10254; H01L 2224/13147; H01L 2224/81409; H01L 2224/81411; H01L 2224/81413; H01L 2224/81416; H01L 2224/81447; H01L 2224/81455; H01L 2224/81444; H01L 2224/81439; H01L 2224/81469; H01L 2224/81464; H01L 2924/014; H01L 2224/11614; H01L 2224/821; H01L 2224/92124; H01L 2225/06513; H01L 2225/06541; H01L 2224/16145; H01L 2224/24145; H01L 2224/73209; H01L 2224/13109; H01L 2224/13111; H01L 2224/13113; H01L 2224/13155; H01L 2224/13144; H01L 2224/13139; H01L 2224/13169; H01L 2224/13164; H01L 2224/13116
  See application file for complete search history.

(56) References Cited

U.S. PATENT DOCUMENTS

| | | | |
|---|---|---|---|
| 8,138,019 | B2 | 3/2012 | Yoon et al. |
| 2002/0112370 | A1* | 8/2002 | Gurer .................. G03F 7/16 34/476 |
| 2005/0146049 | A1 | 7/2005 | Kripesh et al. |
| 2007/0184579 | A1 | 8/2007 | Huang et al. |
| 2007/0207592 | A1* | 9/2007 | Lu .................. H01L 25/0657 438/455 |
| 2014/0116615 | A1 | 5/2014 | Ogawa et al. |
| 2015/0072450 | A1* | 3/2015 | El-Ghoroury ..... H01L 27/14618 438/23 |
| 2015/0361313 | A1 | 12/2015 | Xie et al. |

OTHER PUBLICATIONS

Final Office Action for U.S. Appl. No. 15/272,804 dated Oct. 4, 2018.
Non-Final Office Action for U.S. Appl. No. 15/272,804 dated Mar. 19, 2019.
Notice of Allowance received for U.S. Appl. No. 15/272,804 dated Sep. 18, 2019.
List of IBM Patents or Patent Applications Treated as Related.

* cited by examiner

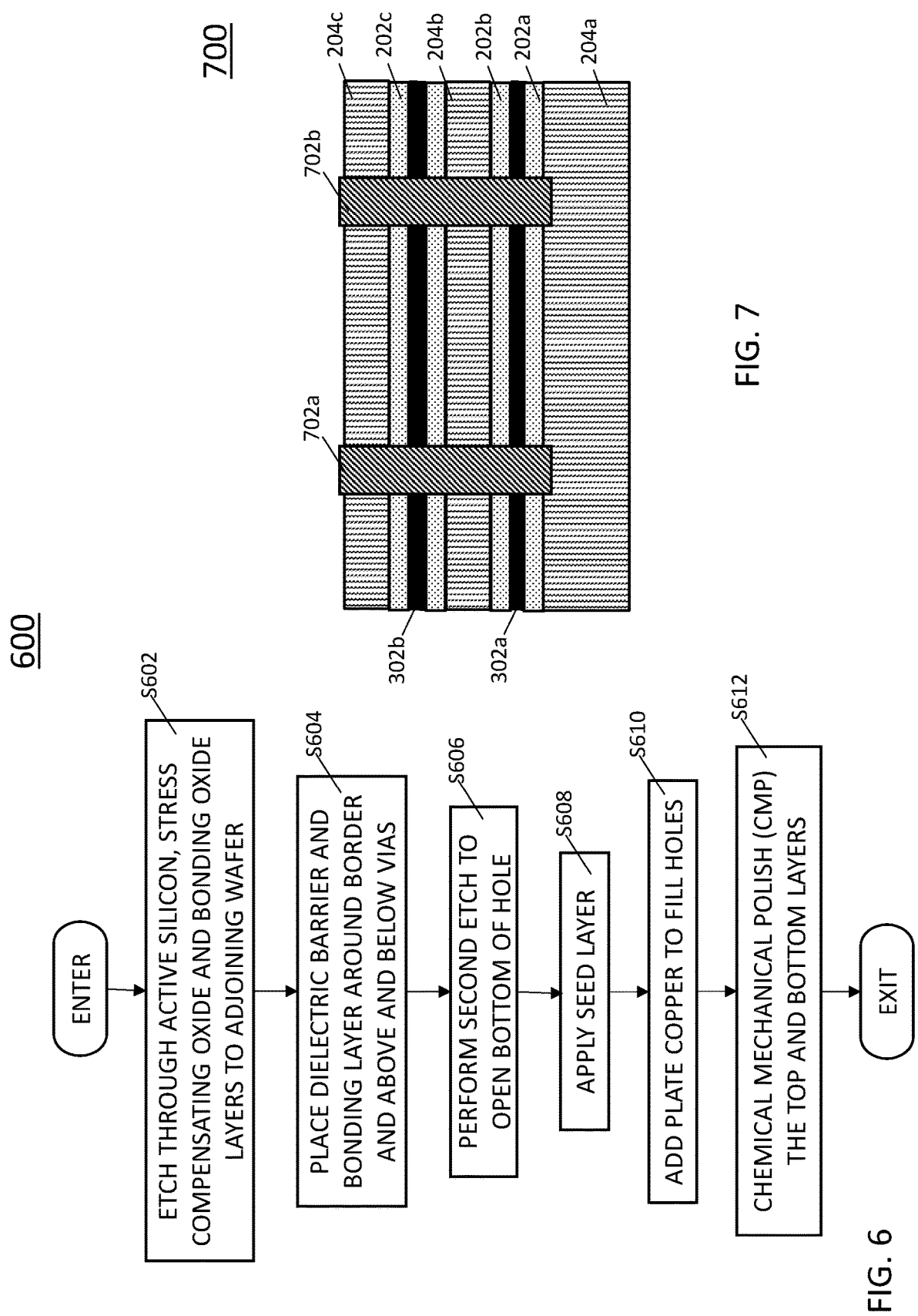

WAFER LEVEL INTEGRATION INCLUDING DESIGN/CO-DESIGN, STRUCTURE PROCESS, EQUIPMENT STRESS MANAGEMENT AND THERMAL MANAGEMENT

CROSS-REFERENCE TO RELATED APPLICATIONS

This application is a divisional application of U.S. patent application Ser. No. 15/272,804, filed Sep. 22, 2016 and entitled "Wafer Level Integration Including Design/co-design, Structure Process, Equipment Stress Management and Thermal Management," the disclosure of which is herein incorporated by reference in its entirety.

BACKGROUND

The present disclosure generally relates to wafer level integration for heterogeneous wafers, and more particularly relates to methods and structures to support heterogeneous wafer level integration to overcome wafer to wafer stress.

Wafer level integration for heterogeneous product function and multi-high function in sub-component and product is challenging due to different structures, materials, coefficients of thermal expansion (CTE), processing, equipment, mechanical stresses and thermal considerations. Non-planarity or warpage and breakage at the wafer level present challenges to manufacturing yields.

BRIEF SUMMARY

In one embodiment, a method of manufacturing a multi-layer wafer is disclosed. The method comprises, creating under bump metallization pads on each of the two heterogeneous wafers; applying a conductive means above the under bump metallization pads on at least one of the two heterogeneous wafers; and low temperature bonding the two heterogeneous wafers to adhere the under bump metallization pads together via the conductive means to form a multi-layer wafer pair.

In another embodiment, a multi-layer wafer is disclosed. The multi-layer wafer comprises two heterogeneous wafers, each of the heterogeneous wafers having under bump metallization pads and a conductive means applied above the under bump metallization pads on at least one of the two heterogeneous wafers. The two heterogeneous wafers are low temperature bonded together to adhere the under bump metallization pads together via the conductive means to form a multi-layer wafer pair.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 6 is an operational flow diagram illustrating one process of forming connections thru the dielectric layers of a multi-layer wafer according to one embodiment of the present disclosure;

FIG. 7 is a cross-sectional illustration showing the heterogeneous wafers of FIG. 5 having multiple wafers added to the stack according to one embodiment of the present disclosure;

DETAILED DESCRIPTION

In this disclosure, methods and structures are provided to support heterogeneous wafer level integration of multi-stack structures to overcome wafer to wafer stress (e.g., mechanical, thermal or other) due to different wafer materials, processes, design, bonding, interconnections or other factors at the wafer and/or die level. These structures and methods reduce stresses between the wafers to minimize warpage during processing and reduce stress in the joined structures in the sub-component, multi-die stack and/or integrated structure for more robust product applications.

Figure 1:
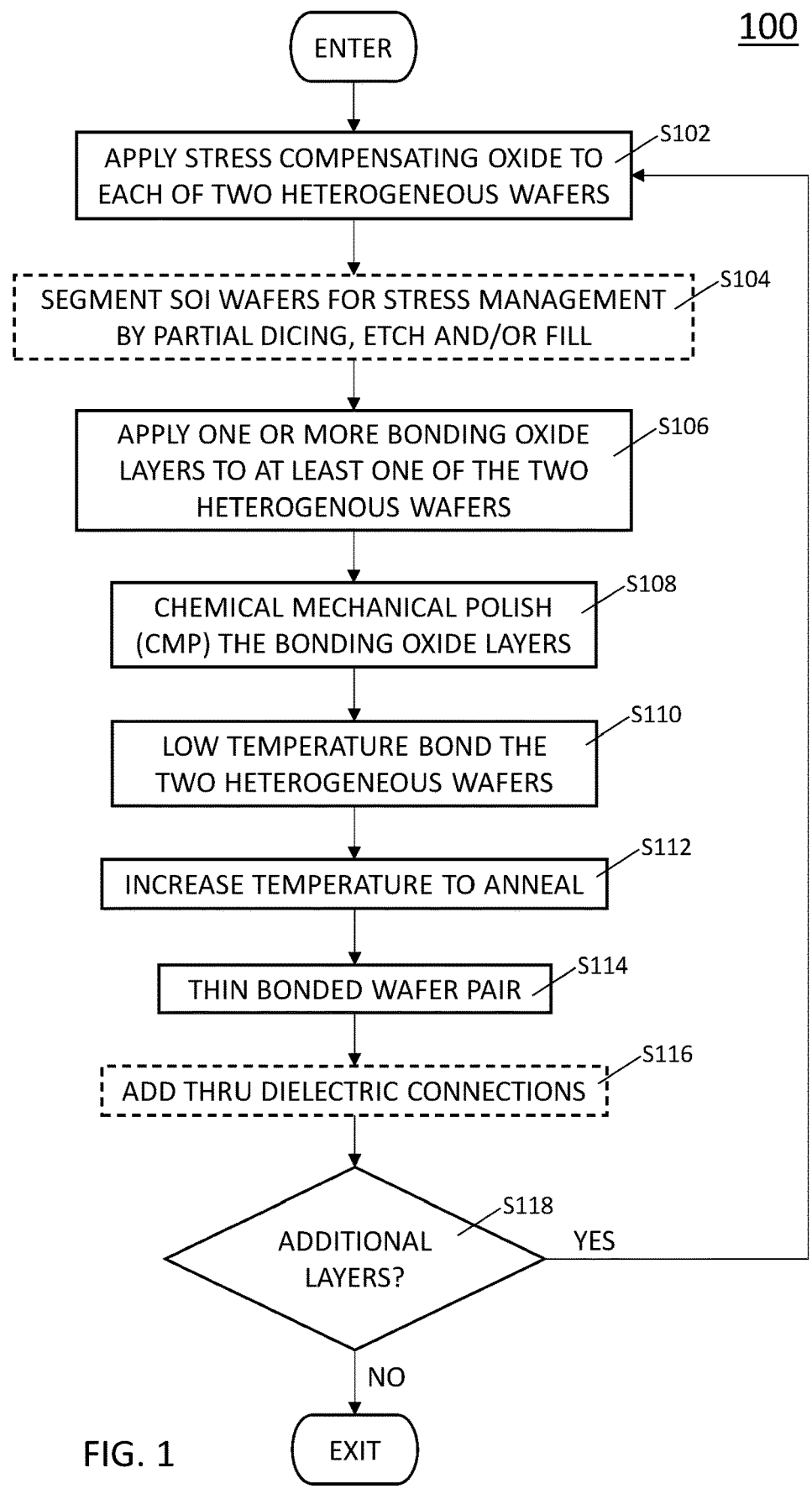
FIG. 1 is an operational flow diagram illustrating one process of manufacturing multi-layer wafers using a stress compensating oxide layer according to one embodiment of the present disclosure.
Figure 2:
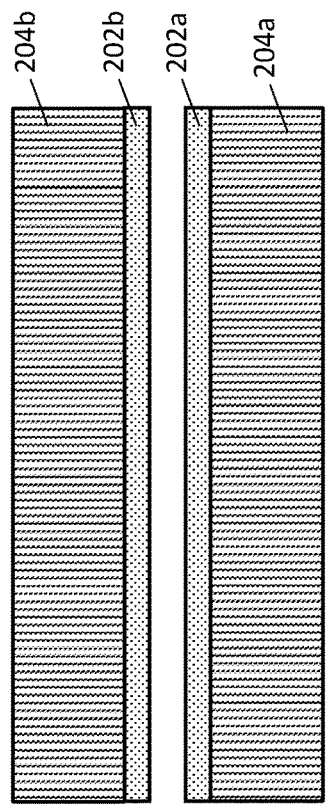
FIG. 2 is a cross-sectional illustration of an example of two heterogeneous wafers having at least one stress compensating oxide layer according to one embodiment of the present disclosure.

Referring now to FIG. 1, an operational flowchart 100 is provided which illustrates one example process of manufacturing multi-layer wafers using a stress compensating oxide layer. It should be noted that optional steps of the process 100 are indicated by dashed lines. The process begins by applying, at step S102, a stress compensating oxide layer 202a, 202b (referenced generally herein as "stress compensating oxide layer 202") to one side of each of two heterogeneous wafers 204a, 204b (referenced generally herein as "heterogeneous wafer 204" or "wafer 204") which comprise active silicon circuits, as shown in FIG. 2. The heterogeneous wafers 204 may be formed of complementary metal-oxide semiconductor (CMOS) and GaN on Si; CMOS and glass or sapphire; CMOS and SiC, diamond or sapphire on Si; or any other suitable heterogeneous wafers or semiconductor on insulator (SOI) structures and materials.

The stress compensating oxide layer 202 may be comprised of, for example, tetraethyl orthosilicate (TEOS) where the composition of the structure can be deposited as a non-stoichiometric SiOx composition where X may vary from an estimated X=2+/−<0.5 as initially deposited. Due to non-stoichiometric composition, the deposited film provides some compensation to stress between the joined heterogeneous structures. Each stress compensating oxide layer 202 may include a variable stoichiometric SiOx range across the thickness of the deposition or may have a targeted stoichiometric composition within the deposition thickness to aid with mismatch of coefficients of thermal expansions (CTE) of the wafers 204 to be bonded in order to avoid excessive stress and potential defects such as localized or component fractures and achieve good bonding across the wafers 204 with reduced bonded wafer bow or warpage.

Optionally, the wafers 204 may be segmented by design or location of the heterogeneous during fabrication and/or at step S104, for example, by creating channels between die on the wafers 204 using partial dicing, etching, or laser ablation and/or subsequent material fill. The channels serve to isolate regions of the heterogeneous film from being continuous across the wafer and relieve stress across the wafer 204 and between die, within a die or for multiple groups of die on a wafer 204. The channels are formed by removing material using partial saw sizing or laser ablation of materials having different coefficients of thermal expansions (CTE) in streets between chip sites and then to back fill with oxide and planarize, followed by oxide deposition, planarization and bonding, thereby eliminating a continuous layer during wafer to wafer bonding to avoid full wafer stress build up. The channels can be filled with oxide, polymer or alternate materials to support subsequent planarity requirements for oxide depositions and planarity for wafer to wafer bonding.

Stress may be reduced by controlling the design and thickness of compositions having different CTEs and creating islands of the material in a wafer 204, such as GaN, by growing GaN or alternate material in desired locations, creating a continuous layer and subsequently etching or removing a portion of the continuous film or creating a very thin continuous layer wherein the stress can be acceptable but not to create a continuous thick and thereby high stress layer prior to bonding that leads to unacceptable stress during processing and/or in the product structure. One or both bonding pair wafers 204 may include islands of deposited heterogeneous materials, or fully deposited or grown heterogeneous materials deposited on at least one wafer 204 in the wafer pair. An example could be an epitaxial grown film or alternate heterogeneous film creation. Deposited or grown heterogeneous material may be partially segmented through the heterogeneous wafer, such as by lithographic techniques with resist and deposition or etching, by partial saw sizing at die level, reactive ion etching (RIE), deep reactive ion etching (DRIE), partial laser ablation, chemical etching or an alternate method or combination of methods to create a partial channel or channels in the wafer 204 so as to reduce overall stress in the wafer 204 and to reduce wafer bow. The channels can subsequently be filled with oxide and planarized, such as by one or more sequences of oxide deposition and chemical/mechanical polishing to fill the trenches and or fill between the islands of heterogeneous material. Typically, this channel oxide deposition may be at the <0.5 µm to 3 µm level in thickness. It should be noted that these islands may be 2 or more per wafer, or may be >100 or 1000 or 10,000 per wafer depending on application requirements and stress level, number of die or heterogeneous materials needed in the application design/layer.

Using one or more oxide deposition structures in a heterogeneous structure, such as between a 3-5 compound epitaxially grown layer (i.e. "epi layer") on a silicon base, with or without islands in the 3-5 compound epi layer and controlling the thickness of the epi layer controls stress of one layer to other layers, such as CMOS layers and/or SiGe layers which may have different CTEs. These structures along with appropriate process method of integration can help manage to support controlled planarity and stress during processing (e.g., wafer thinning, bonding, post bonding anneals, and post bonding processing) and product applications. It should be noted that the after the wafers are singulated, the individual die may or may not include the island structures built at the wafer level.

Figure 3:
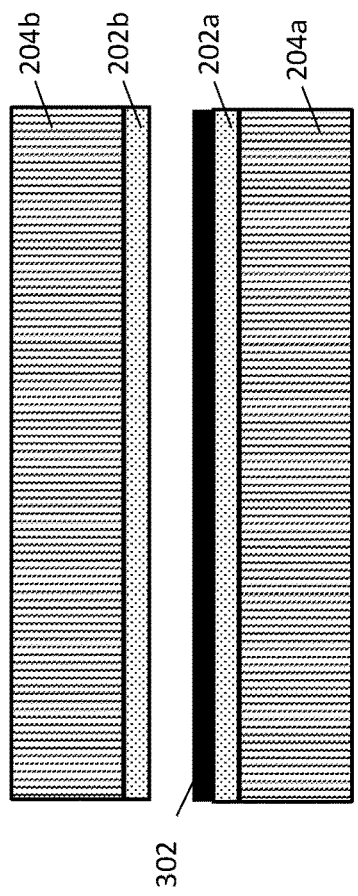
FIG. 3 is a cross-sectional illustration showing the two heterogeneous wafers of FIG. 2, each wafer having a bonding oxide layer according to one embodiment of the present disclosure.

One or more bonding oxide layers 302 are applied, at step S106, to at least one of the two heterogeneous wafers 204, as shown in FIG. 3. The bonding oxide layers 302 may be applied using plasma-enhanced chemical vapor deposition (PECVD). The bonding oxide layer(s) 302 are deposited in one or more sequential steps for one or both bonding pair wafers 204 to overcome surface non-coplanarity to a level that high bonding yield can be achieved. Optionally, one or more thinned laser absorption layers may be deposited.

Chemical-mechanical polishing (CMP) is performed, at step S108, between one or more oxide deposition steps to reduce or eliminate surface planarity of the wafer 204 to the <10 to 50 nm level in thickness. The CMP process may be performed multiple times if needed to acquire the desired thickness and planarity.

The wafers 204 are precision aligned in the X, Y and θ directions to align the wafers 204 to the targeted alignment tolerance. The precision alignment may use infrared (IR) cameras to align the wafers 204 using a minimum of two to greater than 4 to 12 wafer reference alignment marks and best fit alignment algorithms.

Figure 4:
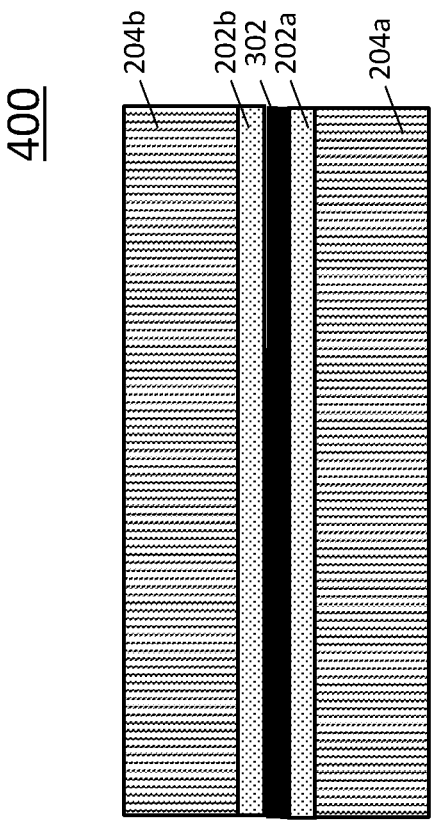
FIG. 4 is a cross-sectional illustration showing the two heterogeneous wafers of FIG. 3 bonded together according to one embodiment of the present disclosure.

The wafers 204 are low-temperature bonded together, at step S110, to minimize stress, forming a bonded wafer pair 400, as shown in FIG. 4. The two wafer 204 surfaces are brought into contact in vacuum or by means of controlled wafer bow so as to not introduce a gas pocket or bubble between the wafer surfaces, then heated at a low temperature. The temperature for initial bonding is dependent on composition of the heterogeneous structures but preferably will be at or near room temperature and typically but not limited to preferably room temperature or up to about 100° C. The temperature is increased, at step S112 to anneal the stress compensating oxide layers and the bonding oxide layers 302 and to enhance the bond strength of the structures. The annealing temperature is also dependent on the structure and composition of the heterogeneous wafers but typically is less than a maximum temperature of 350° C. to 450° C. Additionally, or alternatively, wavelength controlled laser annealing may be utilized and pressure may be applied to the bonded wafer pair 400 to aid in the annealing process. Because the bonding oxide layer 302 has already set at a low temperature, the annealing process at the higher temperature can aid in creating a stronger bond and since the initial bond was set a low temperature, it appears that the high temperature anneal process where a stronger bond can be formed followed a cooling to room temperature which maintains the high strength bond and with return to room temperature a lower stress is achieved compared to an initial high temperature bond and cooling process.

Figure 5:
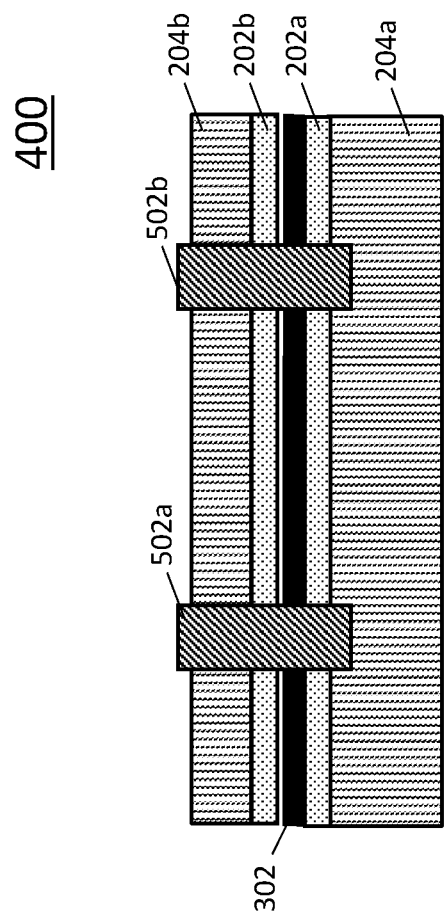
FIG. 5 is a cross-sectional illustration showing the two heterogeneous wafers of FIG. 4 after thinning and adding vertical interconnections according to one embodiment of the present disclosure.

Wafer thinning is performed, at step S114, such as grinding and polishing or grinding and etch processes, to thin one or both wafers 204, as shown in FIG. 5. Generally, only the top wafer 204b is thinned, but the thinning process may also be performed on the lower wafer 204a if needed. Optionally, a handle wafer (not shown) is attached and subsequently removed if needed, to permit interconnection vias 502 such as vertical interconnection vias 502a, 502b through the dielectrics between the die and/or wafers 204, at step S116.

FIG. 6 shows a flowchart 600 of a process for creating interconnection vias 502 in the bonded wafer pair 400. Holes are etched, at step S602, through all layers of the top wafer 204a and through the bottom wafer 204b to reach a contact pad which can then connect to the active circuits of the bottom wafer 204b (e.g., the active silicon of the top wafer 204a, the stress compensating oxide layers 202, and the bonding oxide layers 302). The diameter of the vias may range from less than 1 um to over 100 um and the depth of the vias may vary from <10 to 30 μm to over 50 to 100 um. A thin bonding and barrier layer such as Ta/TaN or Ti/TiN is deposited inside the via such as with CVD (Chemical Vapor Deposition), PECVD (Plasma Enhanced Chemical Vapor deposition) or ALD (Atomic Layer Deposition) at step S604. The center bottom of the deposited bonding and barrier layer can then be opened using lithography, resist, an etch process and clean or by alternate means at step S606. A metal seed layer can then be deposited such as with CVD, PECVD or ALD inside the via such as Cu deposition to act as the seed for subsequent plating build up a metal at step S608. Subsequently, a metal plating process to partially or completely fill the vias such as with Cu is performed at step S610. Following plating, any excess metal over burden can be removed above the vias such as with chemical mechanical polishing at step S612.

Returning now to FIG. 1, additional bonding wafers 204 or wafer pairs 400 may be added, at step S118, to create die and/or multi-layer wafer stacks 700 of more than two wafers 204 in a stack, as shown in FIG. 7, by repeating the process, at step S118. It should be noted that the vertical interconnection vias 702a and 702b may extend through all layers of the multi-layer wafer stack 700.

Figure 8:
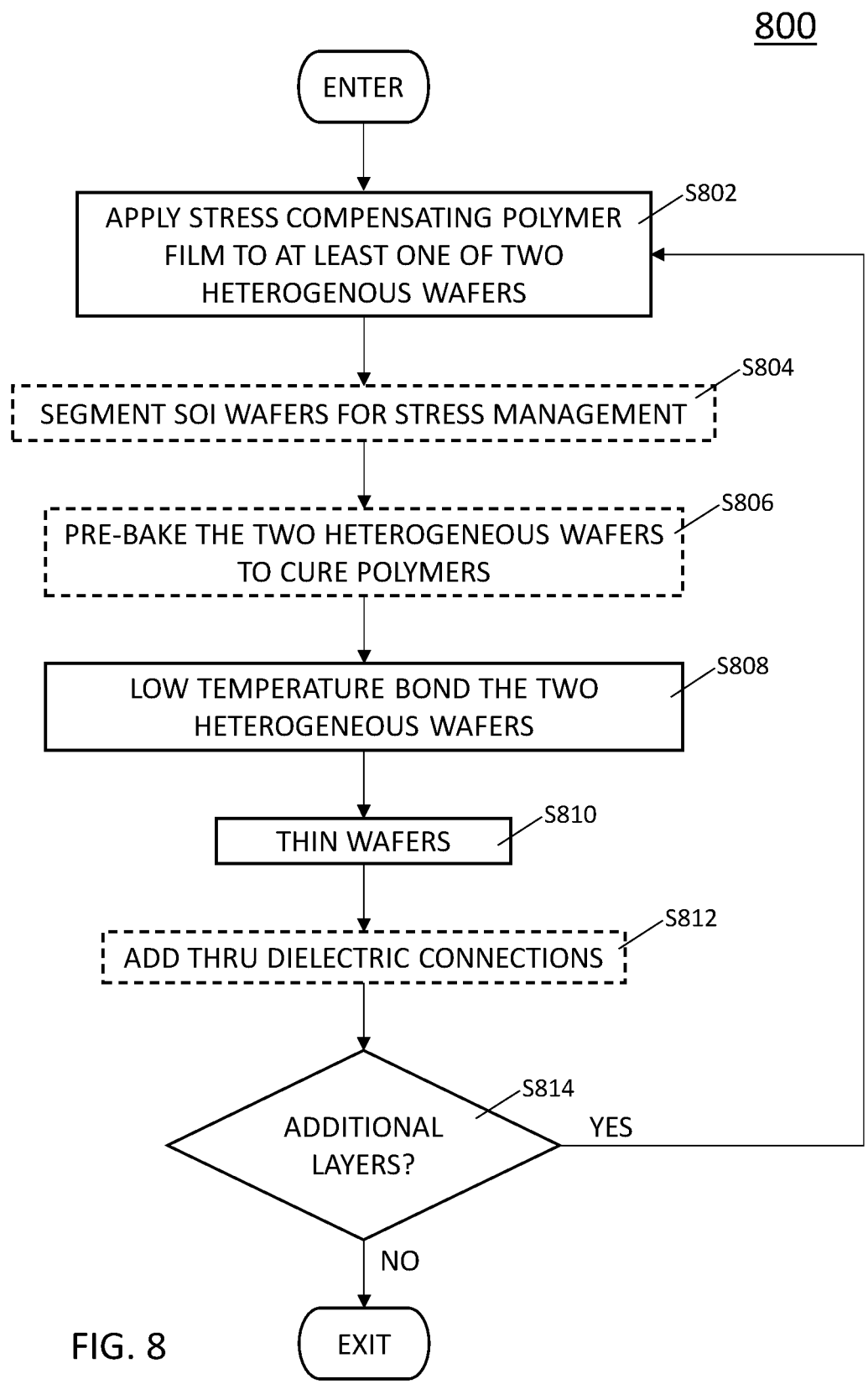
FIG. 8 is an operational flow diagram illustrating another process of manufacturing multi-layer wafers using a stress polymer film layer according to one embodiment of the present disclosure.

Turning now to FIG. 8, an operational flowchart 800 is provided which illustrates another example process of manufacturing multi-layer wafers of heterogeneous wafers using a stress compensating polymer film or a spin-on polymer layer. Again, optional steps of the process are indicated by dashed lines.

Figure 9:
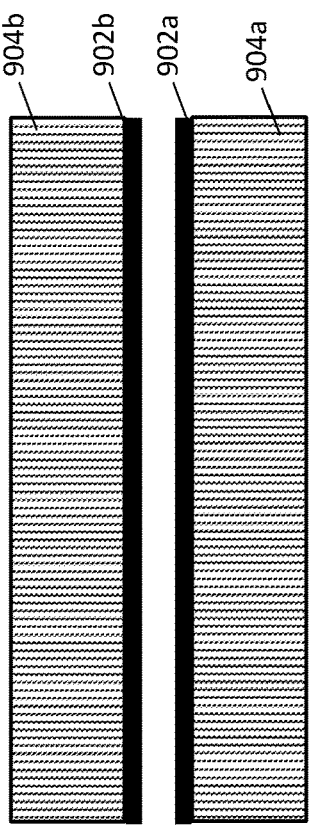
FIG. 9 is a cross-sectional illustration of an example of two heterogeneous wafers where each wafer includes at least one stress compensating polymer layer according to one embodiment of the present disclosure.

As with the process described above, and shown in FIG. 9, two heterogeneous wafers 904a, 904b (referenced generally herein as "heterogeneous wafers 904" or "wafers 904") may be formed of complementary metal-oxide semiconductor (CMOS) and GaN on Si; CMOS and glass or sapphire; CMOS and SiC, diamond or sapphire on Si; or any other suitable heterogeneous wafers or semiconductor on insulator (SOI) structures and materials.

A stress accommodating or compensating polymer bonding layer 902a, 902b is applied, at step S802, to at least one of the two heterogeneous wafers 904a, 904b. The stress compensating polymer layer 902 may be applied by depositing polymer material or applying a liquid polymer on top of the heterogeneous wafer 904 and spinning the wafer 904 to evenly distribute the polymer. The thickness of the polymer layer 902 is determined by the viscosity of the liquid polymer and the spin speed. Because the liquid polymer gets evenly distributed by the spinning, there is typically no need to perform a CMP process when a polymer layer is applied prior to bonding. Alternatively, the stress compensating polymer layer 902 may be applied by bonding a free standing sheet of dry polymer film to the heterogeneous wafer 904.

The polymer bonding layer 904 or bonding layers 904a, 904b may consist of a thermal plastic (such as polyimide, polyethylene terephthalate (PET), or alternate composition), an adhesive family of composition for the layer or film (such as epoxy or phenoxy materials or alternate composition), or a co-polymer having good adhesion properties and modulus appropriate for stress compensation. Promoters may be added to the wafer 904 or polymer film 902 to enhance bonding quality (for example, A1100 or alternate material). The polymer layer 902 may also have ultraviolet (UV), infrared (IR) or other absorbers for low temperature curing or enhanced cross-linking enhancement at lower temperature. These additions in the film can be designed to permit UV curing, such as when bonding a silicon wafer to a glass, sapphire or alternate heterogeneous wafer 904 such that the two layers can be joined and bonded using the adhesive with application of heat and pressure to join the two wafers and may benefit from vacuum application to unbounded areas between the wafers. For bonded wafer pairs with a near match in CTE, (for example, a 3 ppm Si wafer bonded to 3 to 5 ppm glass wafer, such as with diameter of 150 mm to 300 mm), a high temperature bond with the polymer adhesive may be used even with temperatures of up to 350° C. to 400° C. with polyimide adhesives. Note for larger diameter wafers, a closer CTE match is preferred for high temperature bonding. For bonded wafer pairs having a larger CTE mismatch, such as 3 ppm Si to 8 to 10 ppm glass for wafers of 200 mm to 300 mm or larger size wafer or panel, a preferred permanent bonding can deploy UV light or UV light/IR light combination with appropriate, curing mechanism or cross linking mechanism or combination of light activated bonding, light/thermal activation for curing and/or cross linking as desired with combinations therein. Note, the bonding polymer layer may require room temperature or low temperature cure in order to minimize stress due to different CTEs, structures or other factors that could otherwise cause the polymer film 902, wafer 904 or wafer bonded pairs to become non-planar or lead to high levels of stress beyond acceptable levels.

Examples of a polymer composition having a UV cure that can provide adhesive and/or stress compensation bond include a medium to high molecular weight polymethylmethacrylate polymer at the level of 10-50% with added liquid multifunctional acrylates for the remaining to make 100%. The functionality is greater than or equal to 2 acrylates/molecule in an amount such that the resulting composition has a softening point around room temperature without being tacky to the touch, but is easily deformed at temperature slightly higher than room temp, such as 40° C. The composition can be exposed to UV light if it contains a photo-initiator, then laminated at elevated pressure at a temperature greater than 40° C. but less than 90° C.

Alternatively, polymer compositions that can be low temperature cured without a UV additive may include basically the same formulation as above, but with the addition of a peroxide initiator such as benzoyl peroxide for temperature at or above 90° C. or an azoisobutyronitrile (AIBN) which are well known to be acrylate curing compounds at or even below 40° C.

Optionally, channels between die on wafers 904 may be created, or a CTE layer or SOI-like layer may be partially segmented, at step S804 to isolate materials, design of chips and stress both across the wafer 904 and between die, within a die or for multiple groups of die on a wafer 904. The channels may be filled with oxide, polymer or alternate materials to support subsequent planarity requirements for oxide depositions and planarity for wafer to wafer bonding. Examples may include GaN on Si, CVD diamond on Si, SiC on Si, glass on Si, dielectrics on semiconductor GaAs, InP, etc.

The use of channels additionally aids in UV light transmission and dispersion in the bonding polymer layer 904 to aide UV curing of polymer(s) at low temperature if required to achieve low stress and coplanar bonded wafer pairs and/or stacks. In this way edge, UV illumination may be made at wafer, panel or die level for a polymer adhesive even if the layers in the stack are not transparent to the UV or curing electromagnetic radiation. Additionally, chemical reactions of alternate chemicals may be added to the polymer layer 902 to aid cross linking. The added use of external source of radiation, ebeam or other means to provide reduce moisture absorption in the polymer layer 902.

The heterogeneous wafers 904 with having a stress compensating polymer layer 902 may be pre-baked, at step S806, to cure the polymer layer 902. Alternatively, the stress compensating polymer layer 902 may be cured using an ultraviolet (UV) cure or laser cured. The wafers 204 are precision aligned in the X, Y and 0 directions to align the wafers 904 to the targeted alignment tolerance. The precision alignment may use infrared (IR) cameras to align the wafers 904 using a minimum of two to greater than 4 to 12 wafer reference alignment marks and best fit alignment algorithms.

Figure 10:
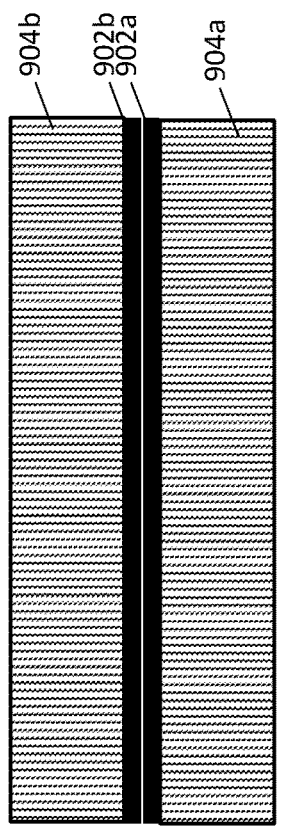
FIG. 10 is a cross-sectional illustration showing the two heterogeneous wafers of FIG. 9 bonded together according to one embodiment of the present disclosure.

The wafers 904 are low-temperature bonded together, at step S808, to minimize stress, forming a bonded wafer pair 1000, as shown in FIG. 10. The two wafer 904 surfaces are brought into contact in vacuum or by means of controlled wafer bow so as to not introduce a gas pocket or bubble between the wafer surfaces, then heated at a low temperature, such as 40° C. to 90° C.

Figure 11:
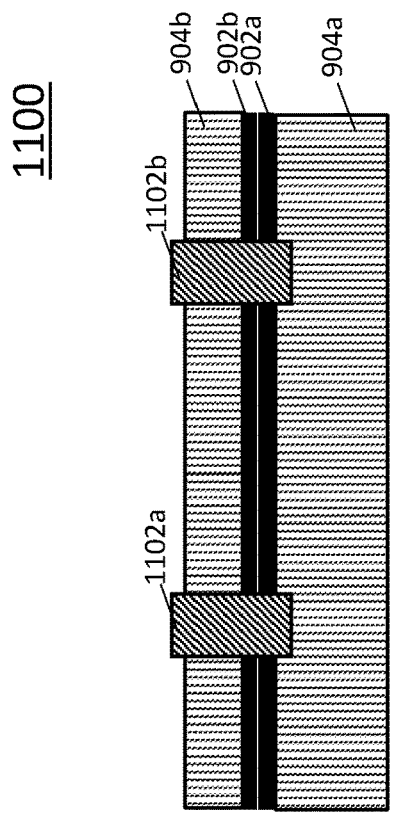
FIG. 11 is a cross-sectional illustration showing the two heterogeneous wafers of FIG. 10 after thinning and adding vertical interconnections according to one embodiment of the present disclosure.

Wafer thinning is performed, at step S810, such as grinding and polishing, or grinding and etch processes, to thin one or both wafers 904, as shown in FIG. 11. Generally, only the top wafer 904b is thinned, but the thinning process may also be performed on the lower wafer 904a if needed. Optionally, a handle wafer (not shown) is attached and subsequently removed if needed, to permit interconnection vias 1102 such as vertical interconnection vias 1102a, 1102b through the dielectrics between the die and or wafers 904, at step S812. The interconnection vias 1102 may be formed according to the process described above in relation to FIG. 6.

Figure 12:
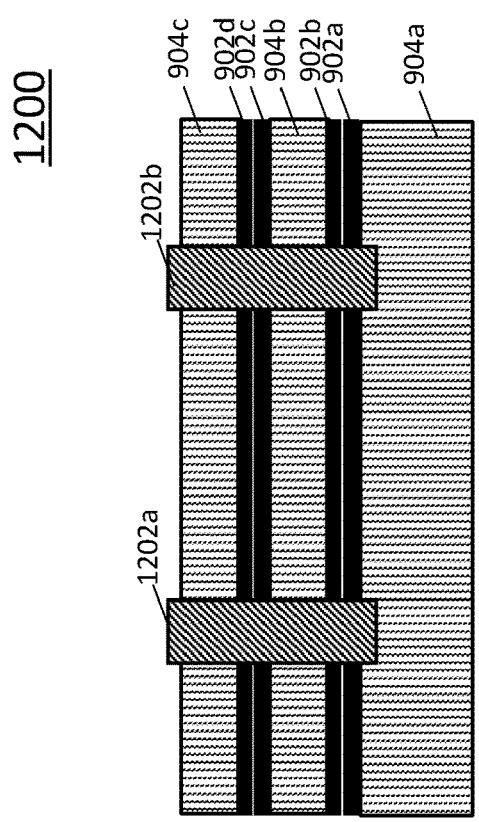
FIG. 12 is a cross-sectional illustration showing the heterogeneous wafers of FIG. 11 having multiple wafers added to the stack according to one embodiment of the present disclosure.

Additional bonding wafers 904 or wafer pairs 1000 may be added, at step S814, to create die and/or multi-layer wafer stacks 1200 of more than two wafers 904 in a stack, as shown in FIG. 12, by repeating the process, at step S816. It should be noted that the vertical interconnection vias 1202a and 1202b may extend through all layers of the multi-layer wafer stack 1200.

Figure 13:
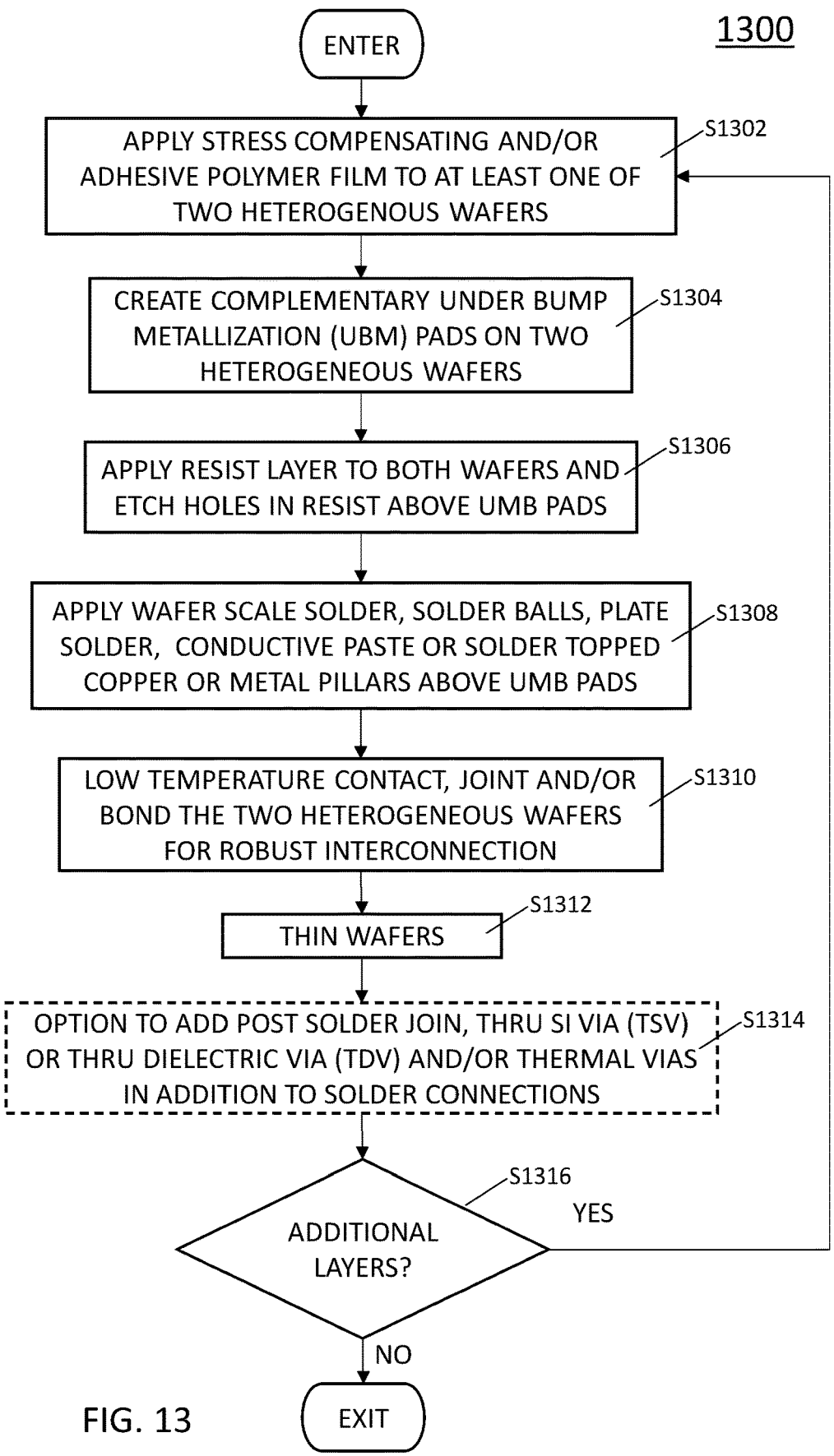
FIG. 13 is an operational flow diagram illustrating another process of manufacturing multi-layer wafers using low temperature joining, bonding and/or welding solder, metal or conductive paste according to one embodiment of the present disclosure.

Turning now to FIG. 13, an operational flowchart 1300 is provided which illustrates another example process of manufacturing multi-layer wafers of heterogeneous wafers using a multi-tier structure with conductors that can be joined at room temperature or low temperature, such as with a low melting point solder. Again, optional steps of the process are indicated by dashed lines.

Figure 14:
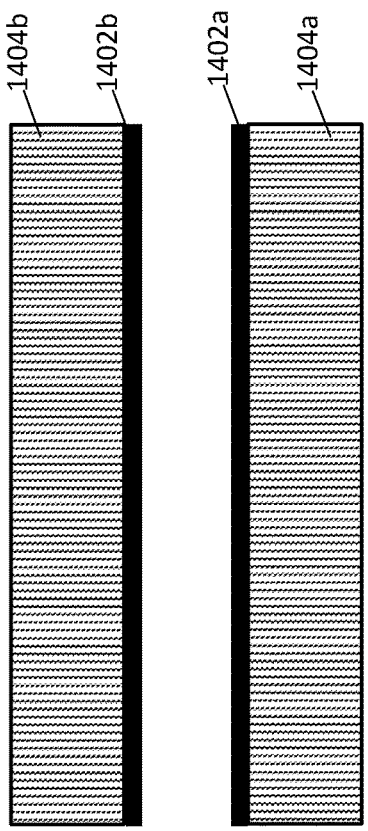
FIG. 14 is a cross-sectional illustration is a cross-sectional illustration of an example of two heterogeneous wafers where each wafer includes an option of at least one stress compensating polymer layer according to one embodiment of the present disclosure.

As with the processes described above, and shown in FIG. 14, two heterogeneous wafers 1404a, 1404b (referenced generally herein as "heterogeneous wafers 1404" or "wafers 1404") may be formed of complementary metal-oxide semiconductor (CMOS) and GaN on Si; CMOS and glass or sapphire; CMOS and SiC, diamond or sapphire on Si; or any other suitable heterogeneous wafers or semiconductor on insulator (SOI) structures and materials. In addition, as described above, channels may be optionally created between die on wafers 1404 that can serve to isolate materials, design of chips and stress both across the wafer and between die, within a die or for multiple groups of die on a wafer which can be filled with oxide, polymer or alternate materials to support subsequent planarity requirements for wafer bonding and planarity for wafer to wafer bonding.

A stress compensating polymer bonding layer 1402a, 1402b and/or an adhesive polymer layer (not shown) is applied, at step S1302, to at least one of the two heterogeneous wafers 1404a, 1404b. The stress compensating polymer layer 1402 may be applied by depositing polymer material or applying a liquid polymer on top of the heterogeneous wafer 1404 and spinning the wafer 1404 to evenly distribute the polymer. Deposition of stress compensating polymers aide to maintain the planarity of the wafers 1404 during bonding. The stress compensating polymers may include tensile or compressive films that are permanent in the structure or temporary, such as films to permit processing and bonding of wafers or panels.

Figure 15:
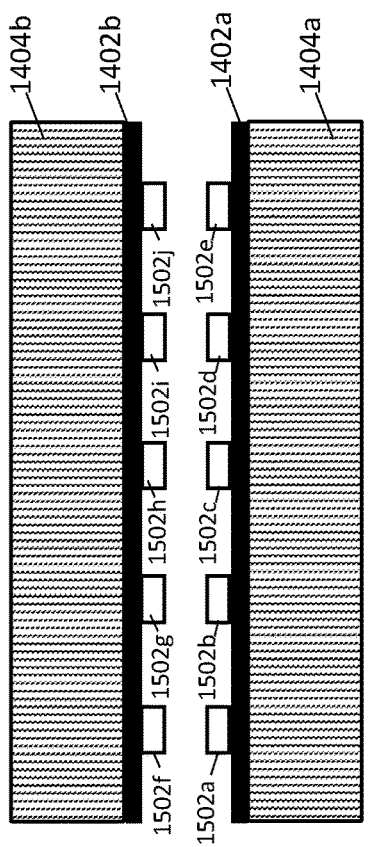
FIG. 15 is a cross-sectional illustration showing the two heterogeneous wafers of FIG. 14 after addition of under bump metallurgy (UMB) pads according to one embodiment of the present disclosure.

Under bump metallization (UBM) pads 1502a-1502j (referenced generally and collectively as "UBM pads 1502") are created, at step S1304, on each of the two heterogeneous wafers 1404, as shown in FIG. 15. It should be noted that the addition of multiple small protrusions on one of the bilayer lipid membrane (BLM) surfaces (such as but not limited to dendrites, metal rods or other structures) may be utilized. Each of the UBM pads 1502 has a complementary UBM pad 1502 located at a mirrored position on the opposite wafer 1404 such that the UBM pads 1502 align when the wafers are bonded/stacked together. The UBM pads 1502 provide conductive anchors in the wafers 1404 that can be joined at room temperature or low temperature using a conductive means, such as solder paste, solder balls or solder topped copper pillars.

Figure 17:
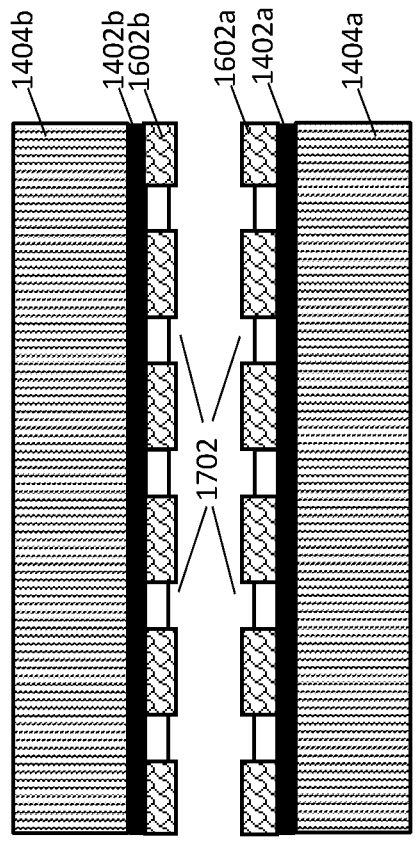
FIG. 17 is a cross-sectional illustration showing the two heterogeneous wafers of FIG. 16 after removal of resist above the UBM pads according to one embodiment of the present disclosure.
Figure 16:
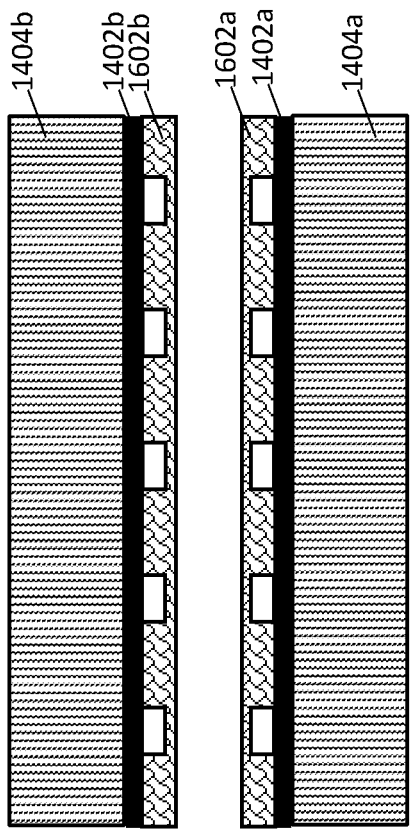
FIG. 16 is a cross-sectional illustration showing the two heterogeneous wafers of FIG. 15 after addition of a resist layer according to one embodiment of the present disclosure.
Figure 18:
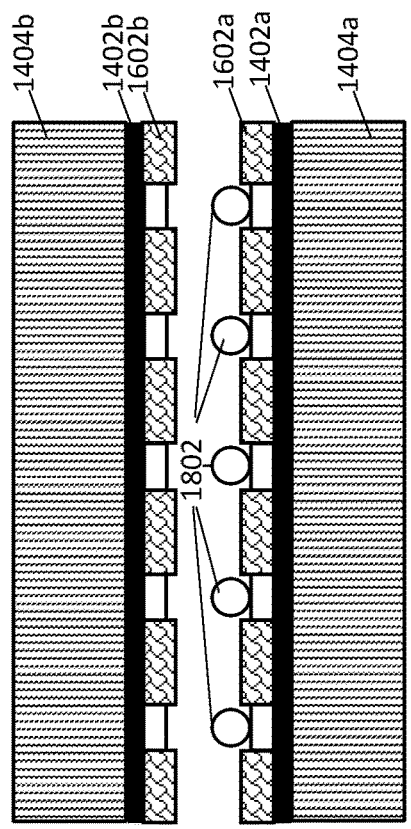
FIG. 18 is a cross-sectional illustration showing the two heterogeneous wafers of FIG. 17 after deposition of solder balls upon the exposed UBM pads of at least one of the wafers according to one embodiment of the present disclosure.

A resist layer 1602a, 1602b is applied, at step S1306, to at least one of the heterogeneous wafers 1404a, 1404b to provide insulation between the UBM pads 1502, as shown in FIG. 16. Holes 1702 are etched in the resist layer 1602, above each UBM pad 1502, to allow access to the UBM pads 1502, as shown in FIG. 17. Solder balls 1802, conductive paste, or solder topped copper pillars are added, at step S1308, on at least one of the heterogeneous wafers 1404, to fill the holes 1702 in the resist layer 1602 and contact the UBM pads 1502, as shown in FIG. 18. The solder, solder balls or solder paste may be applied using injection molded solder, solder plating, metal plating and solder plating, solder screen printing or alternate method. The composition of the solder balls 1802, conductive paste or solder topped copper pillars may consist of In, InSn, InBi, Sn alloys, other high Sn solder alloys, Pb, PbSn, other high lead alloys, Cu, Ni, Au, Ag, Pt, Pd, or combinations therein that can be contacted, joined and bonded at low temperature (e.g., up to about 100° C.) or room temperature. The solder balls 1802, conductive paste or solder topped copper pillars may be bonded in one step or in multiple steps wherein the first step may make contact by pressure between the wafers, may use pad to bump contact, may use one or multiple dendrites or rods to aid contact, may use subsequent pressure and welding (such as laser welding or alternate technique) to improve the localized conductive join and quality of the interconnection. The resist layer 1602 may be optionally removed before or after bonding.

Figure 19:
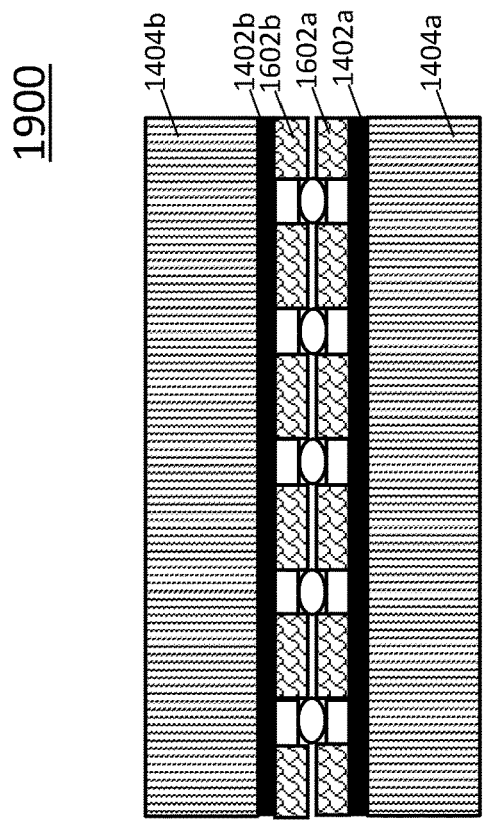
FIG. 19 is a cross-sectional illustration showing the two heterogeneous wafers of FIG. 18 after low-temperature contact, joining, bonding, welding, laser welding, and/or annealing according to one embodiment of the present disclosure.

The wafers 1404 are low-temperature bonded together, at step S1310, to minimize stress, forming a bonded wafer pair 1900, as shown in FIG. 19. The low temperature bonding adheres the complementary UMB pads 1502 together by melting the solder balls 1802. The wafers 1404 may alternatively be connected by low-temperature contact, joining, welding, laser welding, and/or annealing. It should be noted that in case of one BLM pad having dendrites, small rods or other features other than a planar surface, the mating surface may be forced to push onto or over the dendrites, etc., to make a mechanical interlocking until a subsequent improved contact can be made, such as with temperature and solder reflow, thermal compressing bonding, laser welding (such as with an infrared (IR) transparent laser using a 1064 nm wavelength, a wavelength between 1 um and 12 um, or with a wavelength compatible with heating the BLM pad and/or solder locally to cause welding).

The two wafer 1404 surfaces are brought into contact in vacuum or by means of controlled wafer bow so as to not introduce a gas pocket or bubble between the wafer surfaces, then heated at a low temperature, such as 40° C. to 90° C.

Figure 20:
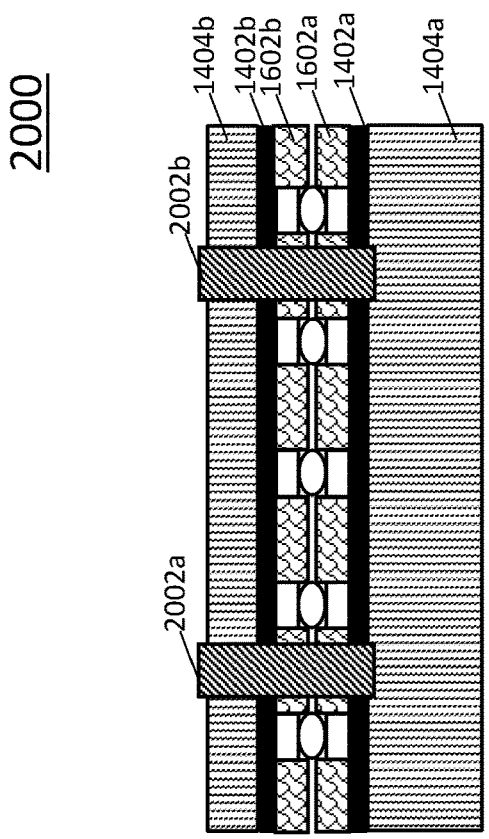
FIG. 20 is a cross-sectional illustration showing the two heterogeneous wafers of FIG. 19 after wafer thinning according to one embodiment of the present disclosure.

Wafer thinning is performed, at step S1312, such as grinding and polishing, or grinding and etch processes, to thin one or both wafers 1404, as shown in FIG. 20. Generally, only the top wafer 1404b is thinned, but the thinning process may also be performed on the lower wafer 1404a if needed.

Optionally, a handle wafer (not shown) is attached and subsequently removed if needed, to permit interconnection vias 2002 such as vertical interconnection vias 2002a, 2002b through the dielectrics between the die and or wafers 1404, at step S1314. Other optional vias may be added post solder joining, such as thru Si vias (TSV), thru dielectric vias (TDV) and/or thermal vias, in addition to solder connections. The interconnection vias 2002 may be formed according to the process described above in relation to FIG. 6.

Figure 21:
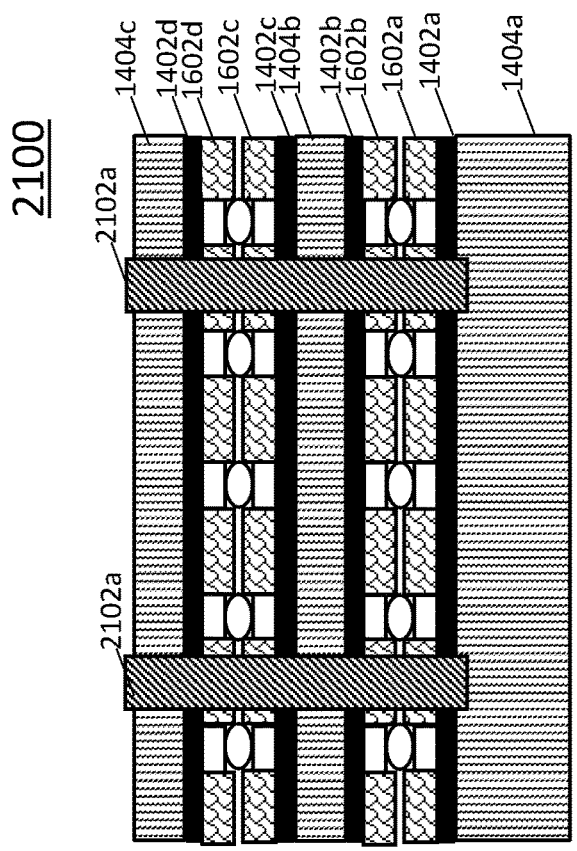
FIG. 21 is a cross-sectional illustration showing the heterogeneous wafers of FIG. 20 having multiple wafers added to the stack according to one embodiment of the present disclosure.

Additional bonding wafers 1404 or wafer pairs 1900 may be added, at step S1316, to create die and/or multi-layer wafer stacks 2100 of more than two wafers 1404 in a stack, as shown in FIG. 21, by repeating the process. It should be noted that the vertical interconnection vias 2102a and 2102b may extend through all layers of the multi-layer wafer stack 2100. Optional optical vias and/or thermal vias may be formed in the stack 2100 to compliment heat transfer through stack 2100 with electrical and non-electrical interconnections.

Note many properties of the material being captured for mechanical stress could also be captured for thermal transport where thickness and thermal conductivity can determine heat spreading and vertical heat transport with opportunity for high thermal conductivity vertical via connections adding to heat removal and high thermal conductivity layers adding to heat spreading.

NON-LIMITING EMBODIMENTS

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of manufacturing a multi-layer wafer comprising:
   creating under bump metallization pads on each of two heterogeneous wafers;
   applying a conductive means above the under bump metallization pads on at least one of the two heterogeneous wafers;
   applying at least one stress compensating polymer layer to at least one of the two heterogeneous wafers, the at least one stress compensating polymer layer having a polymer composition of a molecular weight polymethylmethacrylate polymer at a level of 10-50% with added liquid multifunctional acrylates forming the remaining 50-90% of the polymer composition; and
   low temperature bonding the two heterogeneous wafers to adhere the under bump metallization pads together via the conductive means to form a multi-layer wafer pair.

2. The method of claim 1, wherein each of the two heterogeneous wafers are formed from at least one of: complementary metal-oxide semiconductor (CMOS) and GaN on Si, CMOS and glass, CMOS and sapphire, CMOS and SiC on Si, CMOS and diamond on Si, or CMOS and sapphire on Si.

3. The method of claim 1, wherein the at least one stress compensating polymer layer is formed on the at least one of the two heterogeneous wafer by: applying a liquid polymer to the at least one of the two heterogeneous wafers; and spinning the at least one of the two heterogeneous wafers to evenly distribute the liquid polymer.

4. The method of claim 1, wherein the conductive means is one of solder balls, conductive paste, or solder topped copper pillars.

5. The method of claim 1, wherein the conductive means is formed from one of In, InSn, InBi, Sn alloys, other high Sn solder alloys, Pb, PbSn, other high lead alloys, Cu, Ni, Au, Ag, Pt, Pd, or combinations therein that can be contacted, joined and bonded at low temperature or room temperature.

6. The method of claim 1, further comprising:
   applying a resist layer to at least one of the two heterogeneous wafers; and
   etching the resist layer to define holes in the resist layer above the under bump metallization pads such that the conductive means fills in the holes upon application.

7. The method of claim 6, further comprising the resist layers the resist layer applied to at least one of the two heterogeneous wafers.

8. The method of claim 1, wherein each under bump metallization pad has a complementary under bump metallization pad located at a mirrored position on the opposite heterogeneous wafer such that the complementary under bump metallization pads align when the heterogeneous wafers are bonded together.

9. The method of claim 1, further comprising creating channels between die on at least one of the two heterogeneous wafers.

10. The method of claim 9, wherein the channels are back filled with one of oxide or polymer to create a channel oxide deposition.

11. The method of claim 1, further comprising creating islands of material in at least one heterogeneous wafer by at least one of depositing or growing the material.

12. The method of claim 1, further comprising thinning at least one of the heterogeneous wafers of the multi-layer wafer pair.

13. The method of claim 12, further comprising forming interconnection vias between the two heterogeneous wafers of the multi-layer wafer pair.

14. The method of claim 1, wherein the two heterogeneous wafers are low temperature bonded at a temperature range of room temperature to 100° C.

* * * * *